US006717471B2

United States Patent

(12) United States Patent
Arayashiki et al.
(10) Patent No.: US 6,717,471 B2
(45) Date of Patent: Apr. 6, 2004

(54) AUTOMATIC GAIN ADJUSTMENT CIRCUIT AND AMPLIFIER USING THE SAME

(75) Inventors: Satoshi Arayashiki, Takasaki (JP); Kenji Maio, Tokyo (JP); Takeshi Doi, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/309,140

(22) Filed: Dec. 4, 2002

(65) Prior Publication Data

US 2003/0151461 A1 Aug. 14, 2003

(30) Foreign Application Priority Data

Feb. 12, 2002 (JP) .................................... P2002-033482

(51) Int. Cl.[7] ............................ H03G 3/10; H03G 3/30

(52) U.S. Cl. ........................ 330/278; 330/279; 330/285

(58) Field of Search ........................... 330/86, 96, 278, 330/279, 282, 285

(56) References Cited

U.S. PATENT DOCUMENTS 5,594,383 A * 1/1997 Tamba ........................ 330/253
5,864,416 A * 1/1999 Williams .................... 330/278
6,121,829 A * 9/2000 Tokura ....................... 375/324
6,466,595 B2 * 10/2002 Asano ................... 372/29.021
6,600,374 B2 * 7/2003 Nguyen et al. ............. 330/279

FOREIGN PATENT DOCUMENTS

JP 2001-308651 4/2000

* cited by examiner

*Primary Examiner*—Khanh Van Nguyen
(74) *Attorney, Agent, or Firm*—Reed Smith LLP; Stanley P. Fisher, Esq.; Juan Carlos A. Marquez, Esq.

(57) ABSTRACT

An automatic gain adjustment circuit for automatically adjusting the gain and DC output voltage of an amplifier against power supply fluctuations, temperature fluctuations and process variations and the amplifier using the circuit are provided. The gain and the DC output voltage are adjusted by providing a bias circuit for adjusting the operating current or gain of an amplifying element, connecting a load to the output electrode of the amplifying element to form an output terminal, connecting a variable current source for adjusting the operating voltage or DC output voltage of the amplifying element to the output electrode, connecting a gain detection circuit and a DC output voltage detection circuit to the output terminal, and feed backing the respective outputs of the detection circuits to the variable current source. A reference AC signal is inputted for gain adjustment. After the adjustment, changeover to a signal for amplifying the input is performed, while the output of the gain detection circuit is held in a Sample & Hold circuit.

11 Claims, 15 Drawing Sheets

902
901
Vdd
OUTPUT
97
16
96
95
17
THE INPUT SIGNAL SOURCE
1
98
99
910
SAMPLE &HOLD CIRCUIT
5
72
GAIN DETECTION CIRCUIT
3
DC OUTPUT VOLTAGE DETECTION CIRCUIT
4
SIGNAL INPUT CONTROL CIRCUIT
9
41
21
51
94
91
71
15
92
THE REFERENCE AC SIGNAL SOURCE
2
61
52
93
42
31

3
TO THE VARIABLE
CURRENT SOURCE 32
137
136
LPF
133
Vrg
THE VOLTAGE
REFERENCE
SOURCE
138
Vt
131
139
132
THE OUTPUT OF AN
AUTOMATIC GAIN
ADJUSTMENT CIRCUIT
THE REFERENCE
AC SIGNAL SOURCE 2

AUTOMATIC GAIN ADJUSTMENT CIRCUIT AND AMPLIFIER USING THE SAME

BACKGROUND OF THE INVENTION

1. Field of the Invention

The present invention relates to a circuit for automatically adjusting gain variations resulting from a fabrication process for an amplifier to be mounted on an integrated circuit (hereinafter abbreviated as "IC") and to an amplifier to which the automatic gain adjustment circuit is applied. In particular, it relates to an amplifier effective in a low-noise amplifier (hereinafter abbreviated as "LNA") for use in a communication transceiver or the like.

2. Description of the Related Art

As shown in FIG. 18, an LNA 182 is used in a mobile terminal such as a communication transceiver to amplify an extremely small signal received by an antenna 181. The received signal amplified by the LNA 182 is subjected to frequency conversion in a mixer 183, supplied to a programmable gain amplifier 185 through a band pass filter 184, and subsequently transmitted to a demodulation circuit. A small signal amplifier such as the LNA 182 is normally formed as an IC. In that case, proper setting of the operating points (operating current and operating voltage) and gain of an amplifying element and the stabilization thereof becomes important.

FIG. 19 shows a typical conventional example of an amplifier formed as an IC having a bias circuit for adjusting the operating points. A source-grounded MOS (Metal Oxide Semiconductor) transistor (hereinafter abbreviated as "MOST") 21 is used for the amplifier. A signal inputted from an input signal source 1 to an input terminal 17 is amplified and an output signal is retrieved from an output terminal 16 formed at the connection point between the drain of the MOST 21 and a load (ZL) 12. The operating current Id of the MOST 21 is adjusted by a bias circuit 14 via a resistor 15. The adjustment involves adjusting a DC output voltage at the output terminal 16 such that the dynamic range of an ac output signal is ensured or adjusting an output current flowing in the MOST 21 such that the transconductance of the MOST 21 and the gain determined by the load 12 have respective design values.

On the other hand, there has been known a circuit shown in FIG. 20 as means for implementing a method for independently controlling the gain without changing the voltage at the output terminal (see, e.g., JP-A No. 308651/2001). In the drawing, a current in a constant current source 205 connected in parallel with a load 204 is adjusted such that a current allowed to flow in a MOST 201 has a specified value, i.e., that the transconductance (hereinafter abbreviated as "gm") of the MOST 201 has a specified value, whereby the gain of the MOST 201 is controlled to a desired value. At this time, a bias voltage is supplied to the MOST 201 via a resistor 206 but a voltage $E_O$ at an output terminal 16 hardly changes since it is determined by the gate-to-source voltage $V_{GS}$ in the MOST 201. The operating current of a transistor 203 is determined by a current source 202.

However, the amplifier shown in FIG. 19 suffers power supply fluctuations and temperature fluctuations in an actual situation and further undergoes device variations resulting from changes in fabrication conditions even if it has been designed optimally at a given power supply voltage, at a given temperature, and under given manufacturing conditions. Therefore, the operational voltage, i.e., the DC output voltage at the output terminal 16 and the gain are mostly different from design values. In addition, the gain of the amplifier is normally designed to prevent the distortion of an ac output waveform even if such power supply fluctuations, temperature fluctuations, and device variations as to satisfy conditions under which the gain becomes maximum, i.e., maximum gain conditions are encountered. This has caused the problems that, if such power supply fluctuations, temperature fluctuations, and device variations as to satisfy the minimum gain conditions are encountered, an output signal becomes smaller and the DC output voltage at the output terminal 16 greatly changes simultaneously. A change in DC output voltage affects an input bias voltage in an amplifier in the subsequent stage.

In the amplifier shown in FIG. 20, a current value in the constant current source 205 is fixed when the amplifier is formed as an IC so that it is impossible to tolerate power supply fluctuations, temperature fluctuations, and device variations. Since the voltage $E_O$ is determined by the voltage $V_{GS}$, as stated previously, the voltage $E_O$ cannot be controlled to an arbitrary value.

SUMMARY OF THE INVENTION

It is therefore an object of the present invention to solve the problems of the conventional amplifiers described above and provide an automatic gain adjustment circuit for automatically adjusting the gain and DC output voltage of an amplifier against power supply fluctuations, temperature fluctuations, and process variations and an amplifier using the automatic gain adjustment circuit.

In accordance with the present invention, feed back control is performed with respect to a bias circuit for gain adjustment and a variable current source for DC output voltage adjustment, each of which is provided in the automatic gain adjustment circuit, so that the gain and DC output voltage of an amplifier are set automatically. This allows the set gain and DC output voltage to be held constant even if a power supply and a temperature fluctuate after the fabrication of the amplifier as an IC or if the IC fabrication process varies.

To solve the problems, the present invention uses a method illustrated in FIG. 1 as a gain adjustment method. In the drawing, the adjustment is performed in a bias circuit 14 and a variable current source 13.

An amplifying element 11 having a control electrode a, a ground electrode b, and an output electrode c is composed of, e.g., a MOST, a bipolar transistor, a metal semiconductor (MES) transistor, a hetero-junction transistor, or the like. A bias voltage is supplied from the bias circuit 14 to the control electrode a of the amplifying element 11 via a resistor 15, which determines the operating current of the amplifying element 11. A signal to be amplified is inputted from the input signal source 1 to the input electrode 17 by the control electrode a. The load 12 is connected between the output electrode c of the amplifying element 11 and a power supply Vdd, while the variable current source 13 is connected to the output electrode c of the amplifying element 11. The output terminal 16 is disposed at the connection point between the load 12 and the output electrode c of the amplifying element 11.

The operating current of the amplifying element 11 is the sum of the current in the variable current source 13 and a current flowing in the load 12. A voltage at the output terminal 16 is determined by the load 12 and a current flowing in the load 12.

If a bias voltage in the bias circuit 14 is changed while a current in the variable current source 13 is held constant, the operating current of the amplifying element 11 changes and the current flowing in the load 12 change so that a DC output voltage at the output terminal 16 changes.

If the current in the variable current source 13 is changed while the bias voltage in the bias circuit 14 is held constant, the operating current of the amplifying element 1 hardly changes, while the current flowing in the load 12 changes, so that the DC output voltage at the output terminal 16 changes. The reason for the operating current of the amplifying element 1 which hardly changes even if the DC output voltage changes is that the internal impedance of the amplifying element 11 is generally extremely high and hence the amplifying element 11 can be regarded as a substantially constant current source.

By adjusting the current value in the variable current source 13 and the bias voltage in the bias circuit 14, therefore, it becomes possible to change the operating current without changing the DC output voltage at the output terminal, conversely change the DC output voltage at the output terminal without changing the operating current, or simultaneously change the operating current and the DC output voltage at the output terminal. It is to be noted that the bias voltage in the bias circuit 14 is supplied via the resistor 15.

The signal inputted from the ac input signal source 1 to the input terminal 17 is amplified by the amplifying element 1. As represented by the numerical expression (1) the gain G of the amplifying element 11 is expressed approximately as the product of the transconductance gm of the amplifying element 11 and the load (ZL) 12:

$$G \approx gm \cdot ZL \ldots \quad (1).$$

If the amplifying element 11 is composed of, e.g., a MOST, on the other hand, the transconductance of the amplifying element 11 and the operating current Id thereof has a relationship represented by the following numerical expression (2) therebetween:

$$gm \propto (Id)^{1/2} \ldots \quad (2).$$

If the amplifying element 11 is composed of a bipolar transistor, the transconductance of the amplifying element 11 and the operating current Ic thereof has a relationship represented by the following numerical expression (3) therebetween:

$$gm \propto (Ic) \ldots \quad (3).$$

By adjusting the currents Id and IC in the amplifying element by controlling the bias voltage in the bias circuit 14 and adjusting the DC output voltage by controlling the current allowed to flow in the variable current source 13, therefore, a specified gain and a specified DC output voltage can be obtained at the same time.

Although each of the following embodiments will describe the case where a MOST is used as an amplifying element, the present invention is also applicable to the case where another type of semiconductor amplifying element is used and achieves the same effects.

DETAILED DESCRIPTION OF THE PREFERRED EMBODIMENTS

An automatic gain adjustment circuit and an amplifier using the same according to the present invention will be described herein below in greater detail with reference to the drawings illustrating the preferred embodiments of the present invention.

Figure 1:
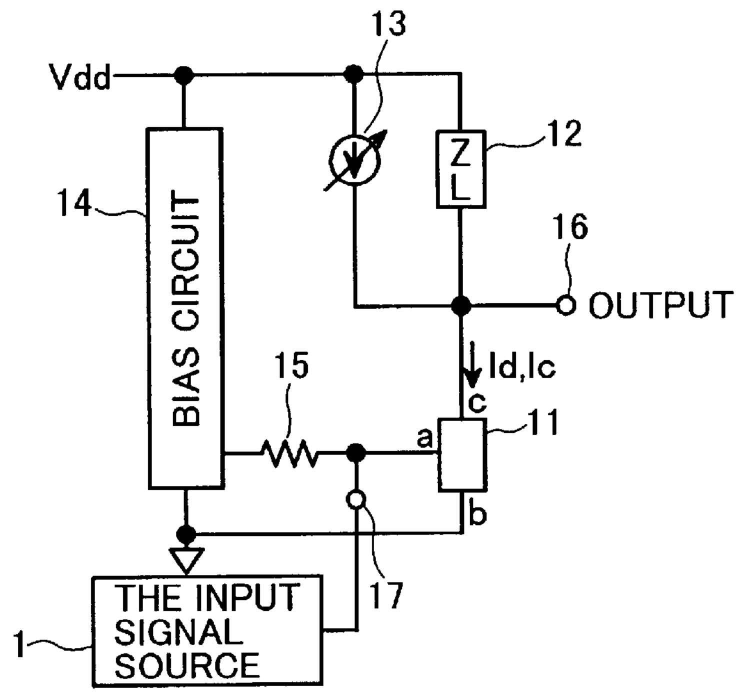
FIG. 1 is a structural view for illustrating a method for adjusting a gain according to the present invention.
Figure 2:
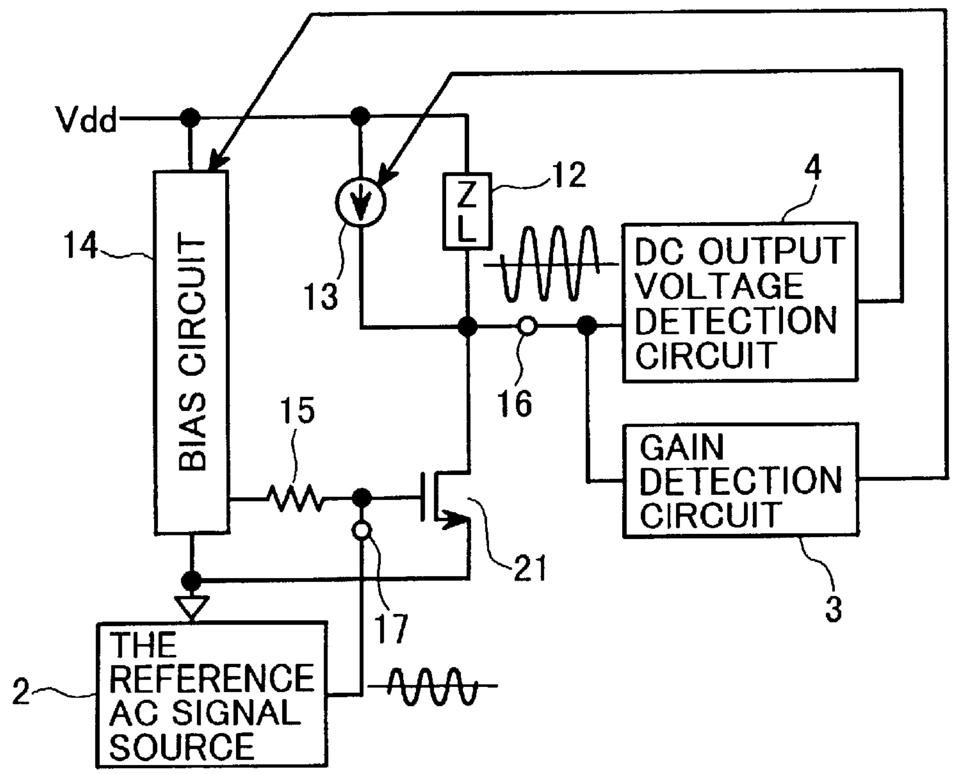
FIG. 2 is a structural view for illustrating a first embodiment of an automatic gain adjustment circuit according to the present invention.

FIG. 2 shows a first embodiment of the automatic gain adjustment circuit according to the present invention. If an AC signal serving as a reference is inputted from the reference AC (alternating-current) signal source 2, the inputted signal is amplified by the MOST 21, as described above, and an amplified AC signal appears at the output terminal 16. The amplitude of the AC output is detected by the gain detection circuit 3 and the output of the gain detection circuit 3 is fed back to the bias circuit 14 such that the amplitude has a specified value, i.e., that the gain has a specified value.

For the achievement of the specified gain, the bias circuit 14 gives a bias voltage to the gate of the MOST 21 via the resistor 15, thereby controlling the operating current of the MOST 21. The output terminal 16 is provided with the DC output voltage detection circuit 3. The output of the DC output voltage detection circuit 3 is fed back to the variable current source 13 such that the DC output voltage has a specified value.

Thus, the present invention allows automatic setting of the gain and the DC output voltage by feed backing the respective outputs of the gain detection circuit 3 and the DC output voltage detection circuit 4, each connected to the output terminal 16, to the bias circuit 14 and to the constant current source 13, respectively. As a consequence, the gain and the DC output voltage can be held constant even if power supply fluctuations, temperature fluctuation, and IC process variations occur after the formation the amplifier as an IC.

Figure 3:
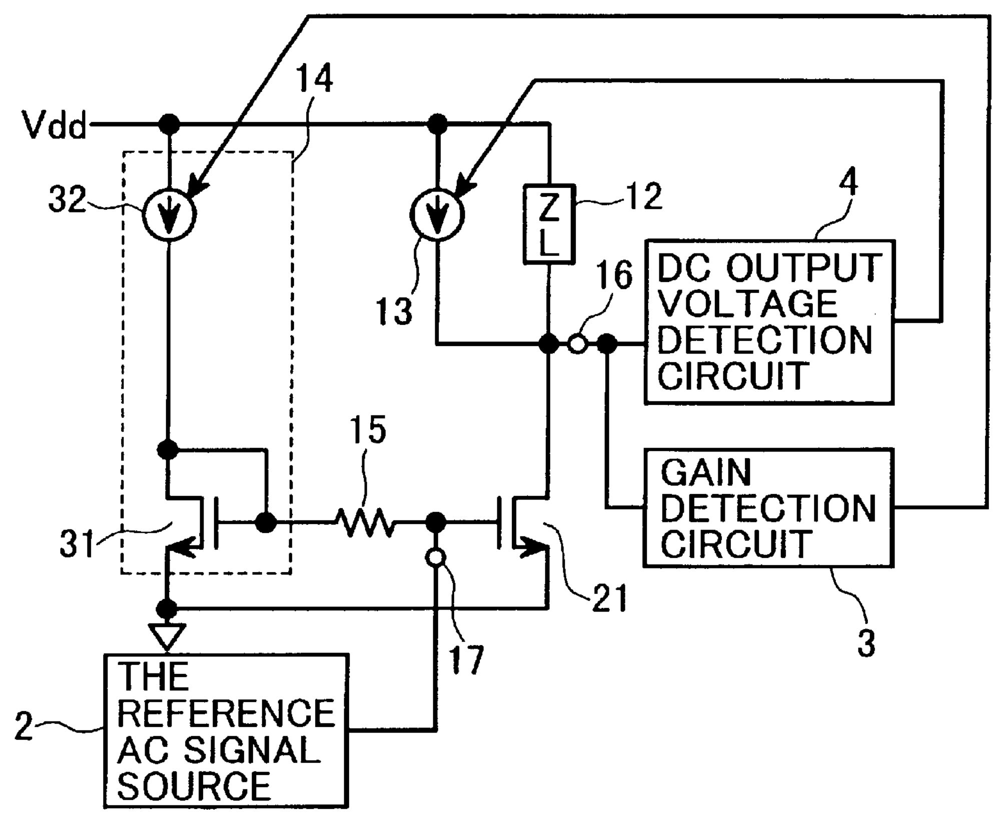
FIG. 3 is a circuit diagram for illustrating an example of a bias circuit in the automatic gain adjustment circuit shown in FIG. 2.

FIG. 3 shows an example of the bias circuit 14 shown in FIG. 2. Since the MOST 21 and a MOST 31 form a current mirror, the output of the gain detection circuit 3 is fed back to the variable current source 32 such that the gain, i.e., the operating current of the MOST 21 has a set value.

The amplifier according to the present invention uses the MOST 21 as an amplifier by switching the reference AC signal source 2 to the input signal source 1 after the bias voltage in the bias current 14 and the current value in the current source 13 are determined.

Figure 4:
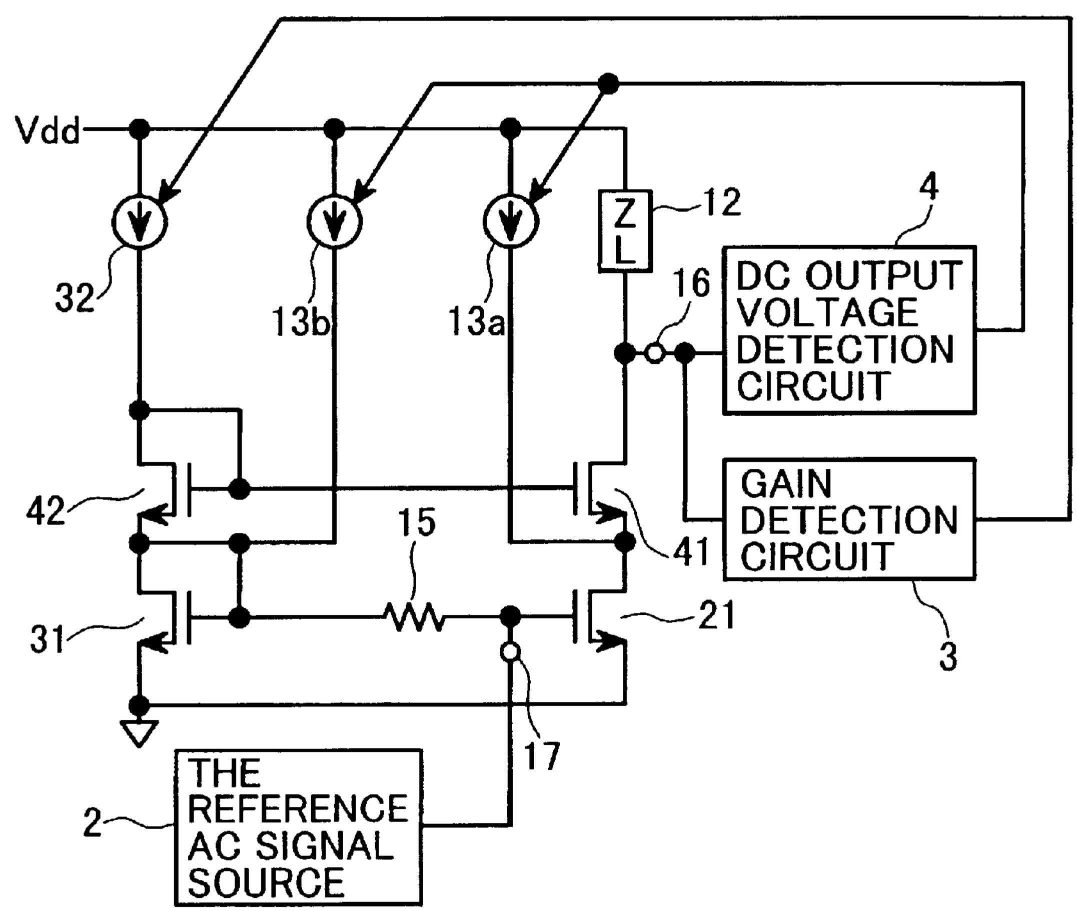
FIG. 4 is a structural view for illustrating a second embodiment of the automatic gain adjustment circuit according to the present invention.

FIG. 4 shows a second embodiment of the automatic gain adjustment circuit according to the present invention. The present embodiment has connected the MOST 21 and a MOST 41 in cascode and thereby widened the frequency range of the amplifier. The MOST 41 is inserted between the output electrode of the MOST 21 and the load 12 with the variable current source 13*a* being connected to the output electrode (drain electrode) of the MOST 21.

The gain of the amplifier is determined by the gm of the MOST 21. The MOST 41 transmits a current obtained by subtracting, from the operating current of the MOST 21, the current in the variable current source 13*a*. By increasing or reducing the current in the variable current source 13*a,* the DC output voltage at the output terminal 16 is changed accordingly. The input signal supplied to the gate electrode, i.e., input terminal 17 of the MOST 21 is converted by the MOST 21 to a current of the gm-fold magnitude. The resulting signal current is given as it is to the load 12 via the MOST 41.

In the bias circuit also, MOSTs 31 and 42 are connected in cascode and the current in the variable current source 32 is supplied thereto in the same manner as in the amplifier. A variable current source 13*b* in which the same current flows as flowing in the variable current source 13*a* is connected between the MOSTs 31 and 42. The MOSTs 31 and 21 form a current mirror and the same current as flowing in the MOST 31 flows in the MOST 21. By changing the current in the variable current source 32, therefore, the operating current of the MOST 21 changes so that the gain of the amplifier changes. By thus achieving the cascode connection also in the bias circuit, a balance is provided between the amplifier and the bias circuit so that variations in gain and DC output voltage are reduced.

In the present embodiment also, the output of the gain detection circuit 3 is fed back to the variable current source 32 and the output of the DC output voltage detection circuit is fed back to the variable current sources 13 and 13*b* such that each of the gain and DC output voltage is automatically controlled to a specified value. Although a current in the MOST 21 is changed through the adjustment of the respective currents in the variable current sources 13*a* and 13*b,* the variable current source 32 is adjusted again with feedback from the gain detection circuit 3 so that a specified gain is set.

Figure 5:
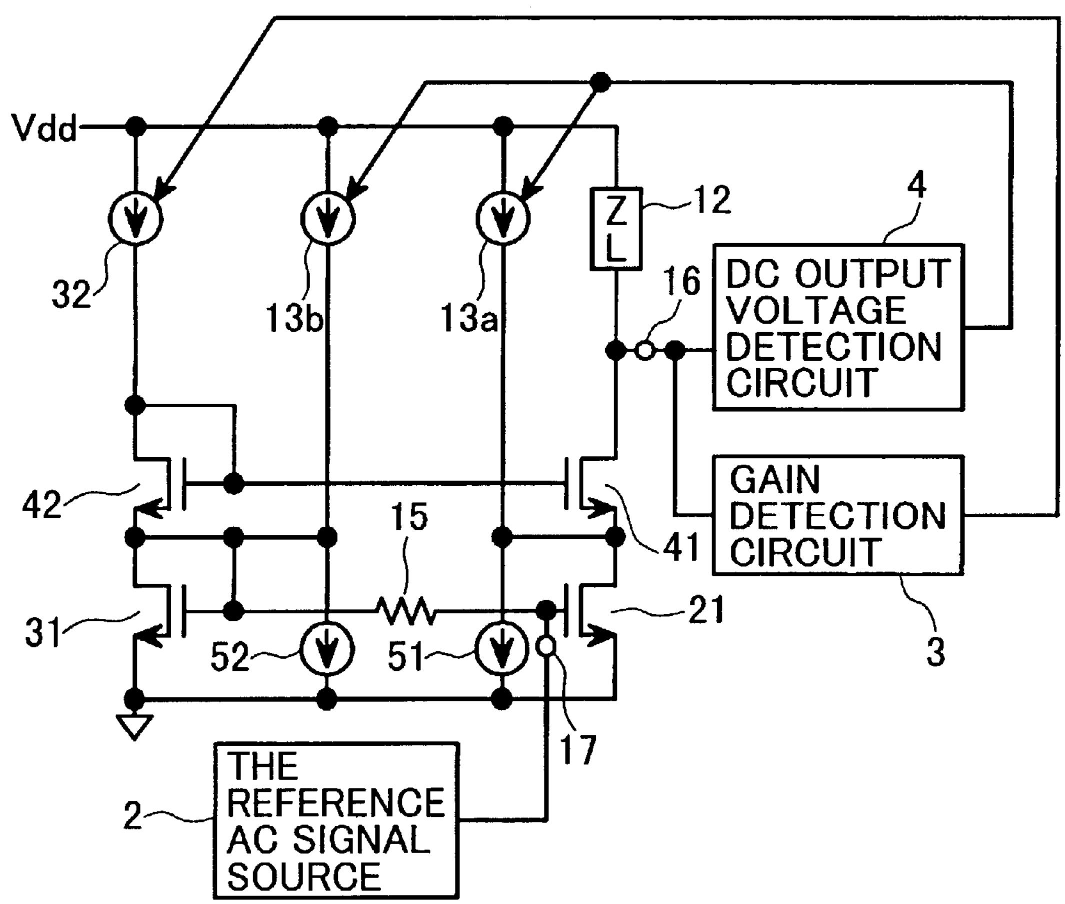
FIG. 5 is a structural view for illustrating a third embodiment of the automatic gain adjustment circuit according to the present invention.

FIG. 5 shows a third embodiment of the present invention, which is obtained by adding constant current sources 51 and 52 to the circuit shown in FIG. 4. In the absence of the additional constant current sources 51 and 52, there are cases where the gain is increased excessively by the device variations, power supply fluctuations, and temperature fluctuations of a MOST so that, even if the currents in the variable current sources 13*a* and 13*b* are adjusted to zero, the DC output voltage exceeds a specified value. To avoid this, the constant current sources 51 and 52 are added to cause the current flowing in the MOST 21 to bypass them and increase the operating current of the MOST 41 so that a specified DC output voltage is obtained.

Although the constant current sources 51 and 52 have been used as shown in FIG. 5, it is also possible to use a resistor instead of the constant current sources 51 and 52 to cause the current to bypass it since the drain-to-source voltage in each of the MOSTs 21 and 31 are stable due to the MOSTs 41 and 42 connected in cascode.

Figure 6:
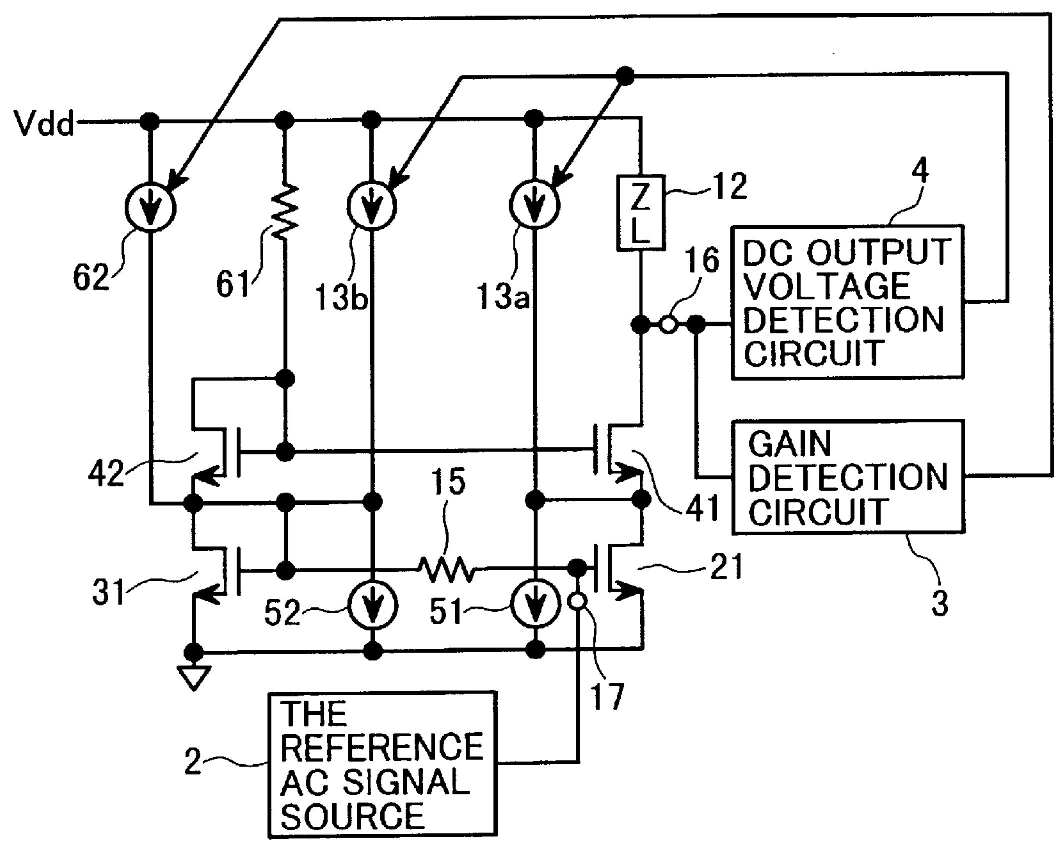
FIG. 6 is a structural view for illustrating a fourth embodiment of the automatic gain adjustment circuit according to the present invention.

FIG. 6 shows a fourth embodiment of the present invention, which is different from the circuit shown in FIG. 5 in that a resistor 61 is used instead of the constant current source 32 which determines the gain and that a variable current source 62 is connected between the MOSTs 31 and 42. The gain is determined roughly by the resistor 61 and the portions connected in cascode and then finely adjusted under the control of the variable current source 62. This reduces a load on the variable current source 62 so that, even if the circuit is operated with a constant power supply voltage, deviation from a constant current operation due to an insufficient drain-to-source voltage in a MOST when it is used as, e.g., a variable current source 62, which will be described later (MOST 93 in FIG. 9), is circumvented.

Figure 7:
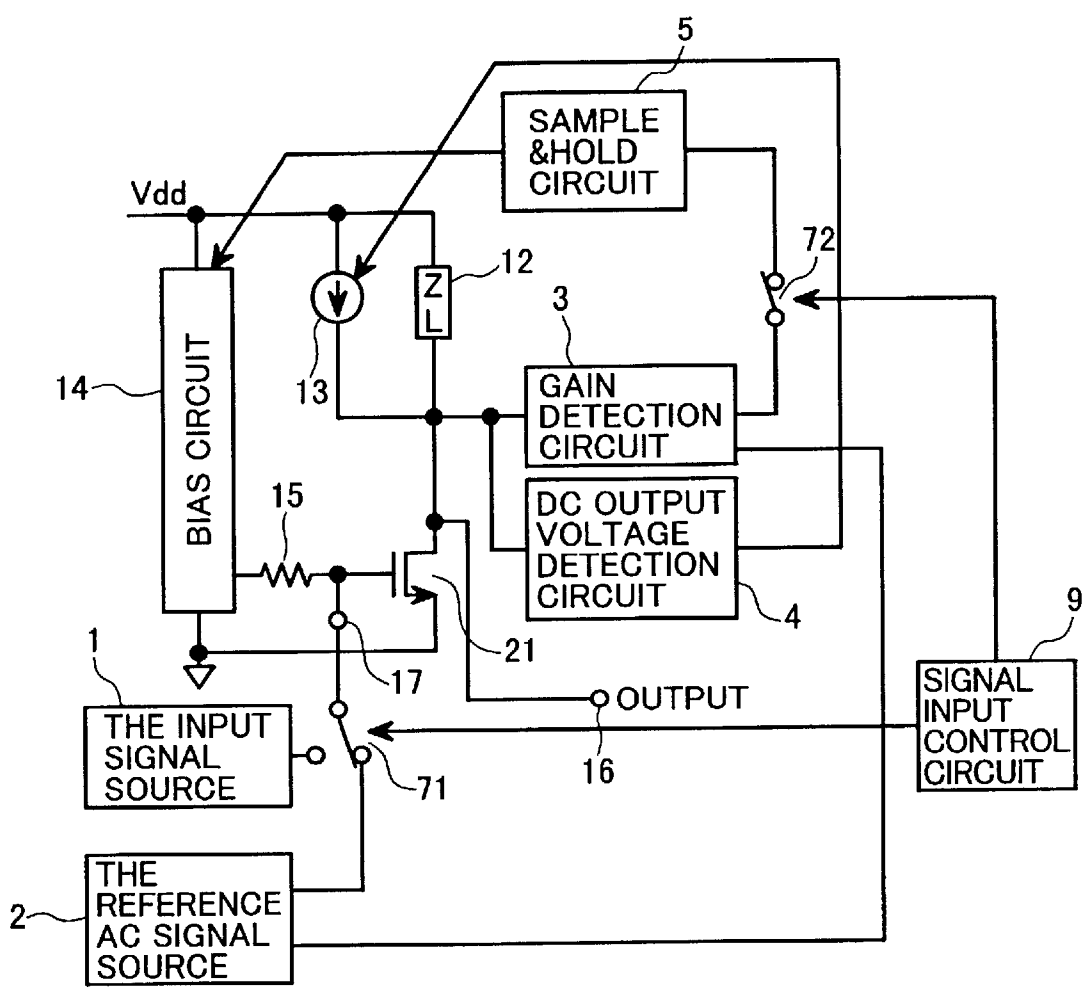
FIG. 7 is a structural view for illustrating a first embodiment of an amplifier with an automatic gain adjustment circuit according to the present invention.

FIG. 7 shows a first embodiment of an amplifier to which the automatic gain adjustment circuit described above has been applied. At first, a switch (hereinafter abbreviated as "SW") 71 is set to the position of the reference AC signal source 2 and a SW 72 is turned ON by the signal input control circuit 9 so that a control value in the bias circuit 14 is held by the Sample & Hold circuit 5. The same state as shown in FIG. 2 is established except that the control value in the bias circuit 14 is held by the Sample & Hold circuit 5, in which the bias circuit 14 and the variable current source 13 are controlled by the gain detection circuit 3 and the DC output voltage detection circuit 4, respectively. The control value in the bias circuit 14 after control is held by the Sample & Hold circuit 5. Then, the SW 71 is switched to the position of the input signal source 1 and the SW 72 is turned OFF. This allows the gain controlled before the changeover of the switches to be used to amplify the input signal.

Figure 8:
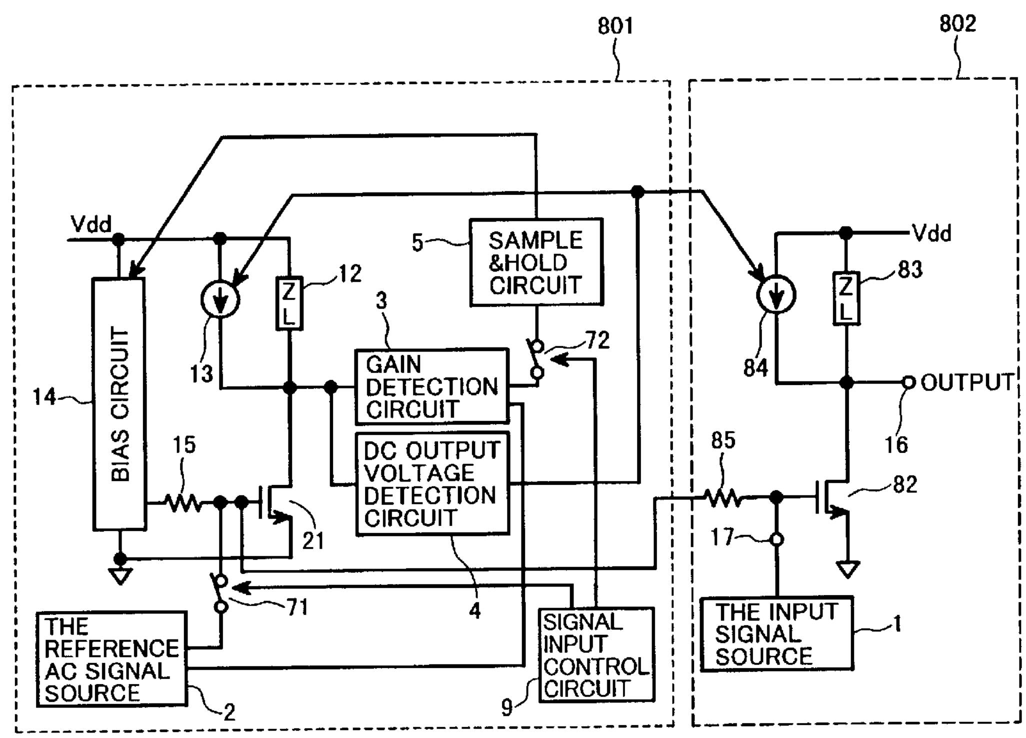
FIG. 8 is a structural view for illustrating a second embodiment of the amplifier with an automatic gain adjustment circuit according to the present invention.

FIG. 8 shows a second embodiment of the amplifier to which the automatic gain adjustment circuit has been applied. The amplifier according to the present embodiment has a main amplifier 802 for amplifying a signal from the input signal source in addition to a circuit 801 for performing gain adjustment by using the reference AC signal source 2. At first, the SWs 71 and 72 are turned ON by the signal input control circuit 9. At this time, the bias circuit 14 and the variable current source 13 are controlled such that a gain and a DC output voltage that have been set individually are obtained in the same manner as in the amplifier shown in FIG. 7. Then, the control value in the bias circuit 14 is held by the Sample & Hold circuit 5.

When the SWs 71 and 72 are turned OFF subsequently, a bias voltage determined by the control value held in the hold circuit 5 is given to a MOST 82 via a resistor 85 in the same manner as to the MOST 21 so that the same control value as given to the current source 13 is given to the variable current source 84. As a result, a gain and a DC output voltage that have been adjusted in the automatic gain adjustment circuit are also obtained at the output terminal 16 connected to the load 83 in the amplifier 802.

In the circuit according to the present embodiment, the main amplifier 802 is disconnected from the circuit 801 during the amplification of the input signal so that the reference AC signal 6 is not inputted as noise and a SW need not be provided between the input signal source 1 and the MOST 82. This provides the circuit with the merit of suppressing SW-induced noise.

Figure 9:
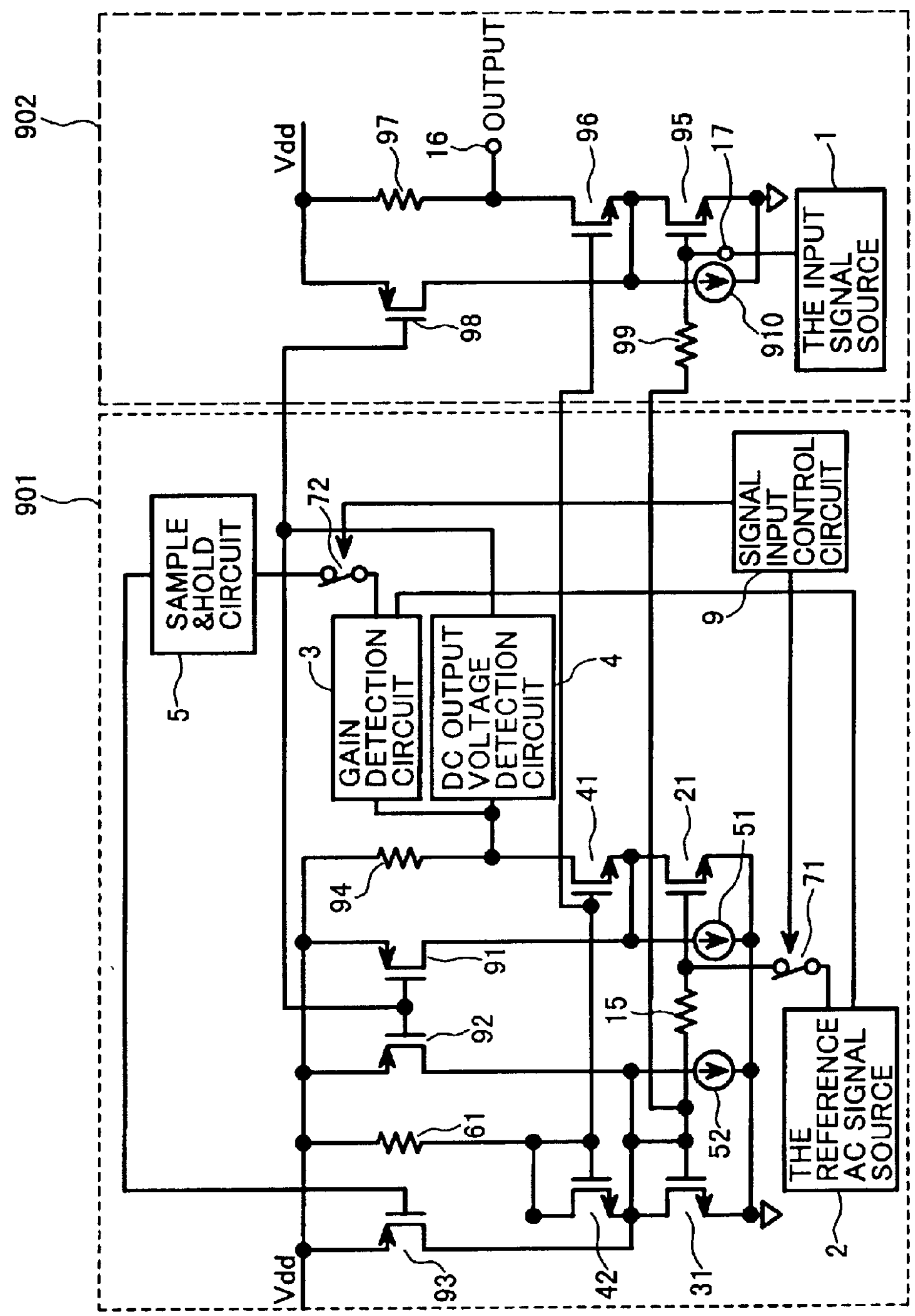
FIG. 9 is a circuit diagram for illustrating in detail an example of the amplifier with the automatic gain adjustment circuit shown in FIG. 8.

FIG. 9 shows in detail an example of the circuit of FIG. 8. An automatic gain adjustment circuit 901 uses the system shown in FIG. 6. The variable current sources 13*a* and 13*b* for gain control of the automatic gain adjustment circuit 901 are produced from p-type MOS transistors (herein after abbreviated as "pMOSTs") 91, 92, and 93. On the other hand, the variable current source 84 for DC output voltage control of the main amplifier 802 is produced from a pMOST 98. The amplifying elements of the main amplifier 802 are MOSTs 95 and 96 connected in cascode. The load 83 is composed of a resistor 97 and a current source 910 is connected between the connection point between the MOSTs 95 and 96 and the ground. A bias voltage is supplied via a resistor 99. The operation is as described above.

Figure 10:
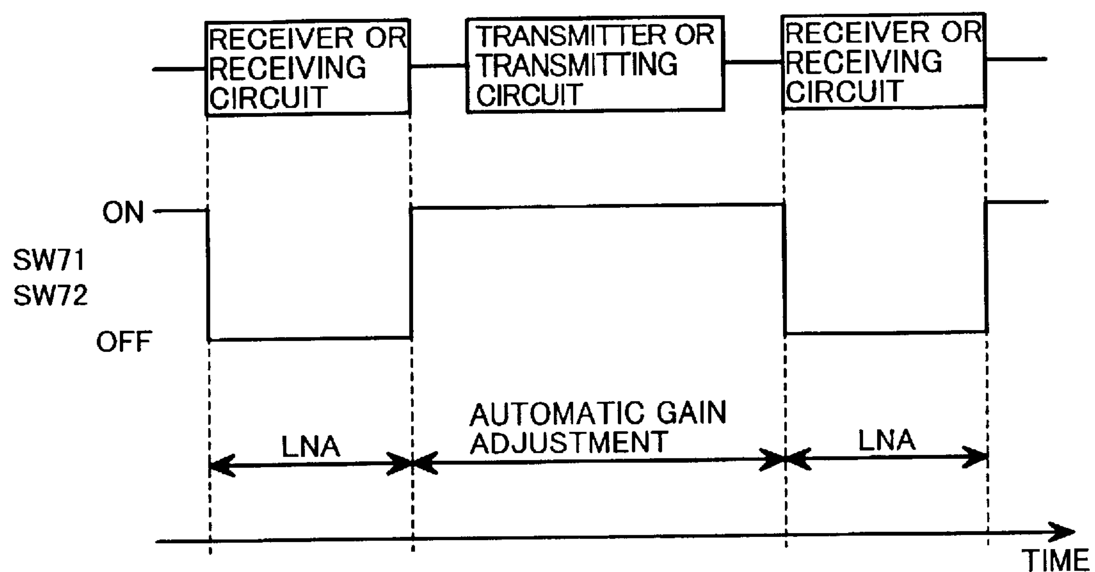
FIG. 10 is a timing chart for illustrating operational timings for change-over switches in the amplifier with the automatic gain adjustment circuit shown in FIG. 8.

FIG. 10 shows an example of timings for the turning ON/OFF of the SWs 71 and 72 performed by the signal input control circuit 9 of an LNA provided in a communication transceiver in the Bluetooth (short-range wireless data communication system) or the like when the amplifier shown in FIG. 8 is used as the LNA. Since the LNA is used during signal reception, the LNA obtains a gain controlled by the automatic gain adjustment circuit by performing automatic gain adjustment during a period undevoted to the signal reception and amplifying a received signal through the changeover of switches during the signal reception. This allows the LNA to amplify the received signal with a constantly optimum gain.

Figure 11:
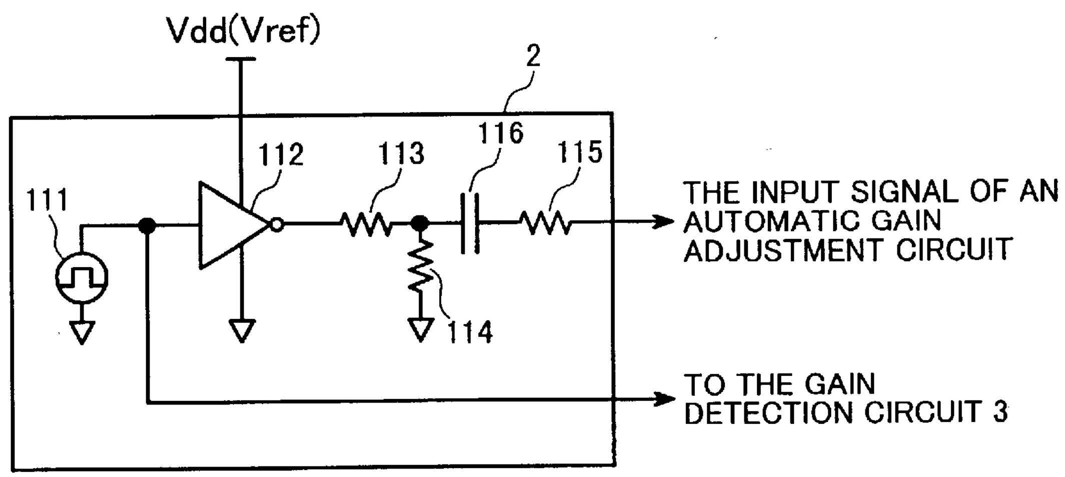
FIG. 11 is a circuit diagram for illustrating an example of a reference AC signal source.

FIG. 11 is an example of the reference AC signal source 2. In the drawing, 111 is a signal on which the AC signal used for gain adjustment is based. As the signal 111, a clock signal used in a wireless communication system can be used. An inverter 112 uses, as a power supply voltage, the power supply voltage Vdd of the automatic gain adjustment circuit or a reference voltage Vref produced from the power supply voltage Vdd. The clock signal has a voltage divided by resistors 113 and 114 and has a DC component removed in a capacitor 116. The clock signal has the voltage further divided by a resistor 115 and the resistor 15 of the automatic gain adjustment circuit to form the reference AC signal of the automatic gain adjustment circuit. The clock 111 is inputted to the gain detection circuit 8.

Figure 12:
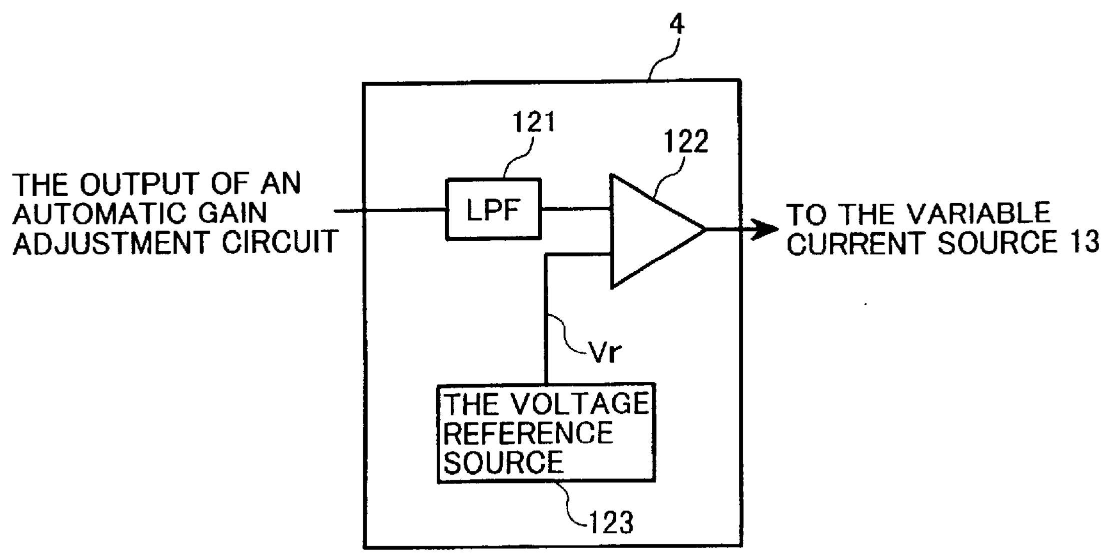
FIG. 12 is a circuit diagram for illustrating an example of a DC output voltage detection circuit.

FIG. 12 shows an example of the DC (direct-current) output voltage detection circuit 4. After a DC component is extracted by a low pass filter (hereinafter abbreviated as LPF) 121 from an output signal at the output terminal 16 in the automatic gain adjustment circuit, the DC component is inputted to an operational amplifier. At that time, the variable current source 13 is controlled such that the DC output voltage in the automatic gain adjustment circuit becomes the reference voltage Vr inputted to another input terminal of the operational amplifier. The reference voltage Vr produced from a reference voltage source 123 is a voltage corresponding to the power supply voltage Vdd of the inverter 112 shown in FIG. 11 or to the constant voltage Vref produced from the power supply voltage Vdd.

Figure 13:
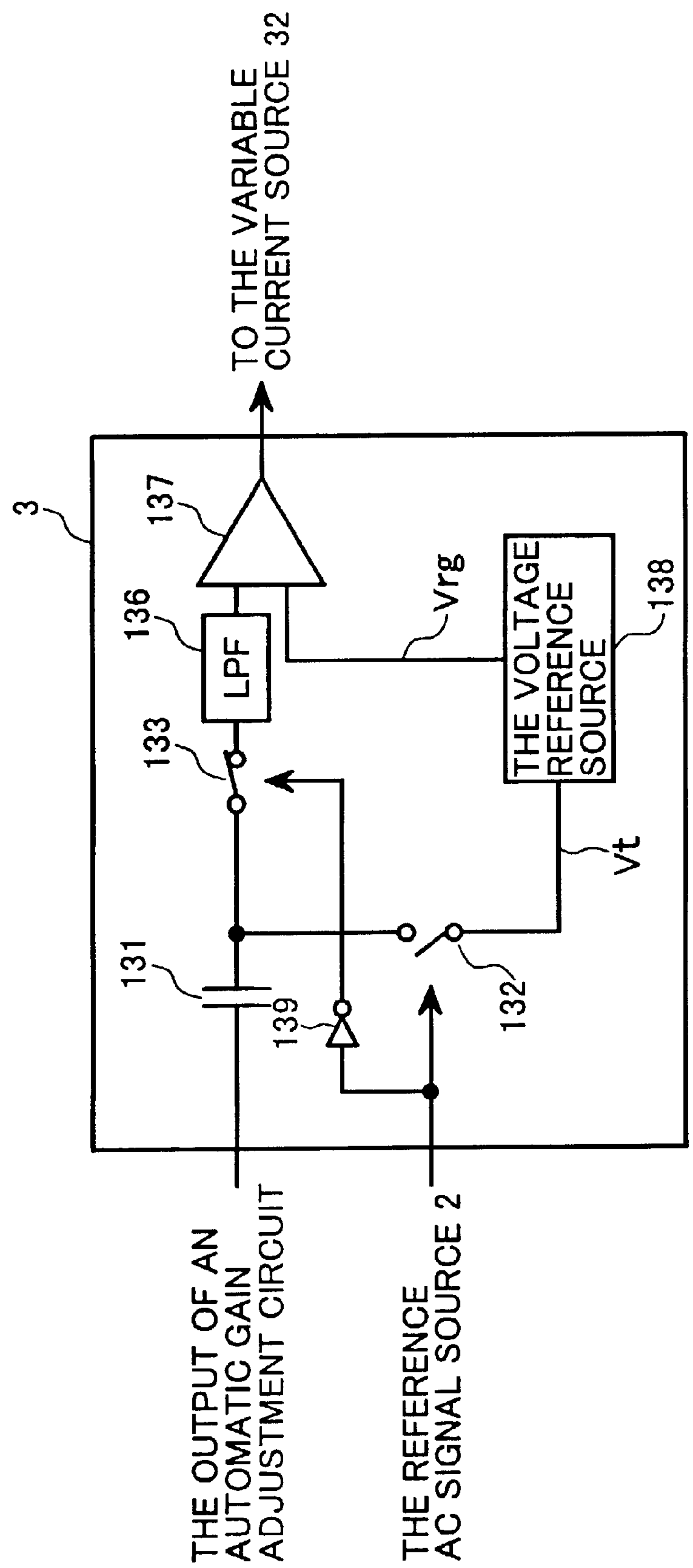
FIG. 13 is a circuit diagram for illustrating an example of a gain detection circuit.
Figure 14:
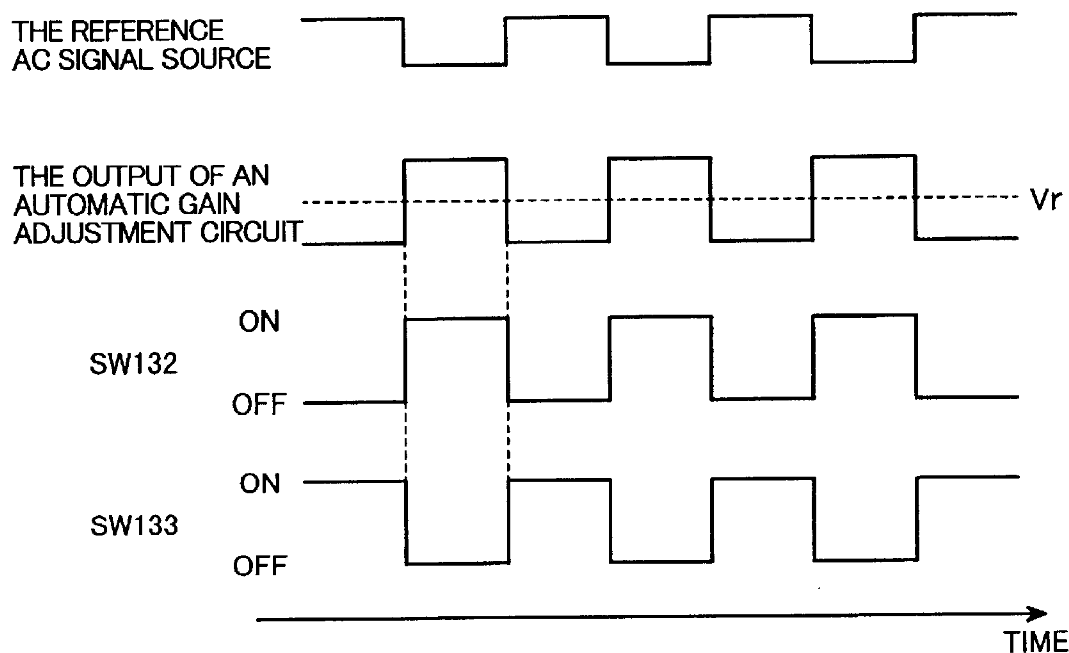
FIG. 14 is a timing chart for illustrating operational timings for the switches in the gain detection circuit.

FIG. 13 shows an example of the gain detection circuit 3. When a pulse produced from the clock is used as the reference AC signal from the reference AC signal source 2, a pulse obtained by multiplying the original pulse by the magnitude of the gain is inputted to the gain detection circuit 3. After the removal of the DC component from the pulse in a capacitor 131, the higher-potential side of the pulse becomes Vt when a SW132 is turned ON depending on the ON/OFF timings (the SW132 is ON if the pulse appearing at the output of the automatic gain adjustment circuit is on the higher potential side and a SW133 is ON if the pulse is on the lower potential side) for the SWs 132 and 133 controlled by the reference AC signal source 2. On the other hand, feedback to the variable current source 32 of the gain adjustment bias circuit 14 and the like is performed via the LPF 136 and the operational amplifier 137 such that the lower potential side of the pulse becomes Vrg when the SW133 is turned ON. This provides a gain formed from Vt and Vrg produced at a reference voltage source 138. FIG. 14 shows an example of a timing chart for the changeover of the SWs 132 and 133 controlled by the reference AC signal source 2.

By producing the power supply of the inverter 112 of the reference AC signal source 2, the reference voltage source 123 (Vr) for setting the DC output voltage, and the reference voltage source 138 (Vt and Vrg) for setting the gain by using the power supply voltage Vdd of the automatic gain adjustment circuit or the constant voltage Vref produced from the power supply voltage Vdd, a constant gain and a constant bias voltage can be obtained even if the power supply voltage varies.

Figure 15:
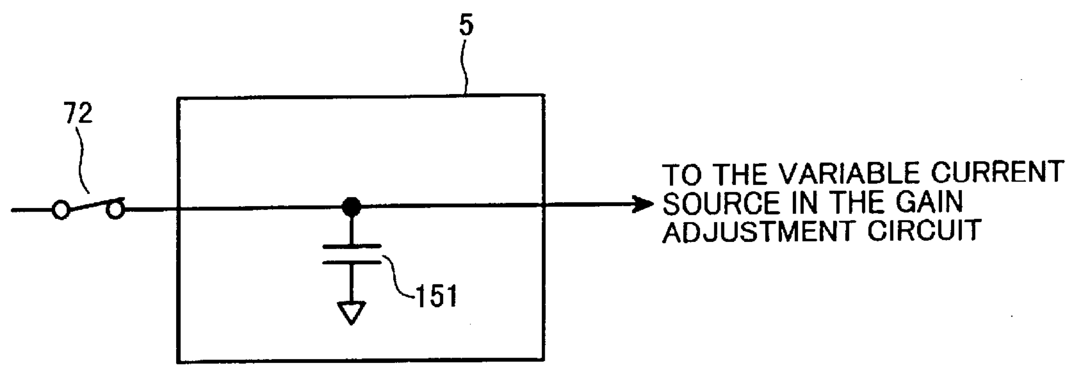
FIG. 15 is a circuit diagram for illustrating an example of a hold circuit.

FIG. 15 shows an example of the Sample & Hold circuit 5. When the SW 72 is ON, the control value for the variable current source for gain adjustment, which is supplied from the detection circuit 3, is held in the capacitor 151. When the SW 72 is turned OFF, the value held in the capacitor 151 is supplied to the variable current source 32 of the bias circuit 14 for gain adjustment and the like.

Figure 16:
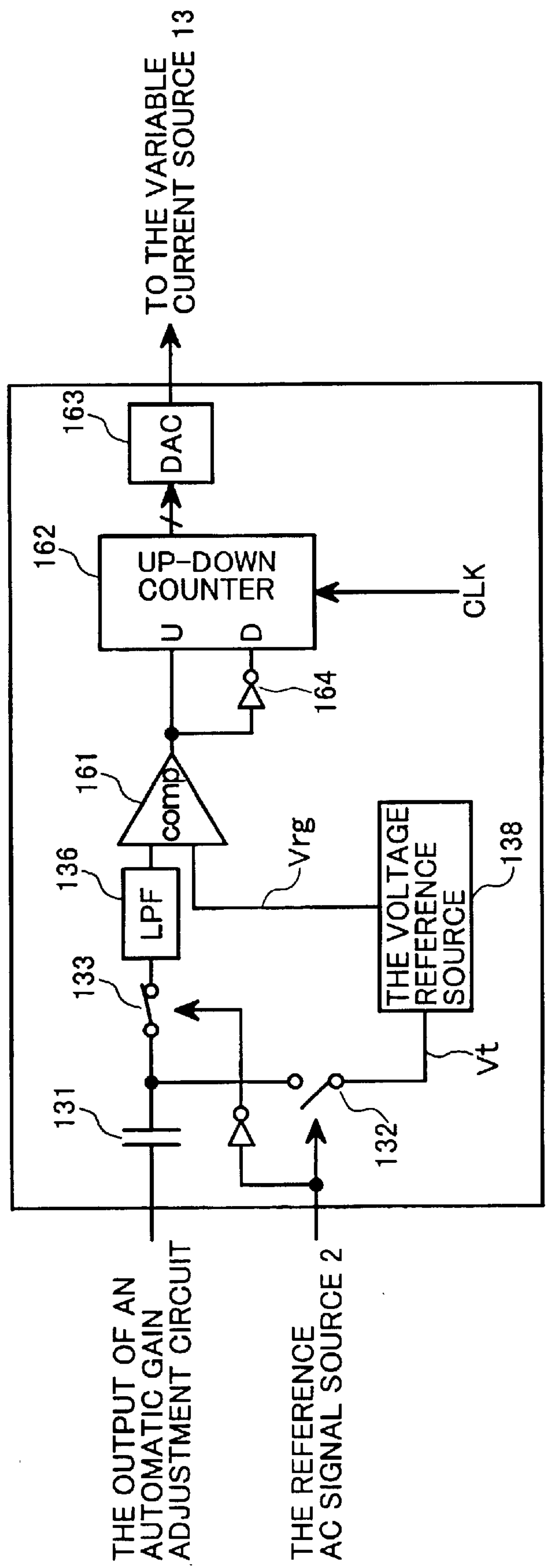
FIG. 16 is a circuit diagram for illustrating an example of the gain detection circuit and a digital hold circuit.

Although each of the embodiments described above has adopted an analog system for the control circuit system of the gain detection circuit 3, a digital system using a digital memory (up-down counter) may also be used instead. FIG. 16 shows an example of the gain detection circuit 3 and the hold circuit 5 in a digital system. Although the components of the gain detection circuit 3 in the stages previous to the LPF 136 perform the same operations, the circuit in the digital system uses a voltage comparator (Comp) 161, an up-down counter 162, and a digital to analog converter (hereinafter abbreviated as DAC) 163. If the output of the LPF 136 is larger than Vrg, the output of the comparator 161 becomes high so that the up-down counter counts up and the output of the DAC is increased. This reduces the current in the variable current source 32 of the bias circuit 14 for gain adjustment and the like and thereby reduces the gain. If the gain is reduced excessively, an operation in the reverse direction occurs so that the gain is eventually adjusted to have a specified value. The up-down counter 162 has a memory function and forms the hold circuit in the digital system.

Figure 17:
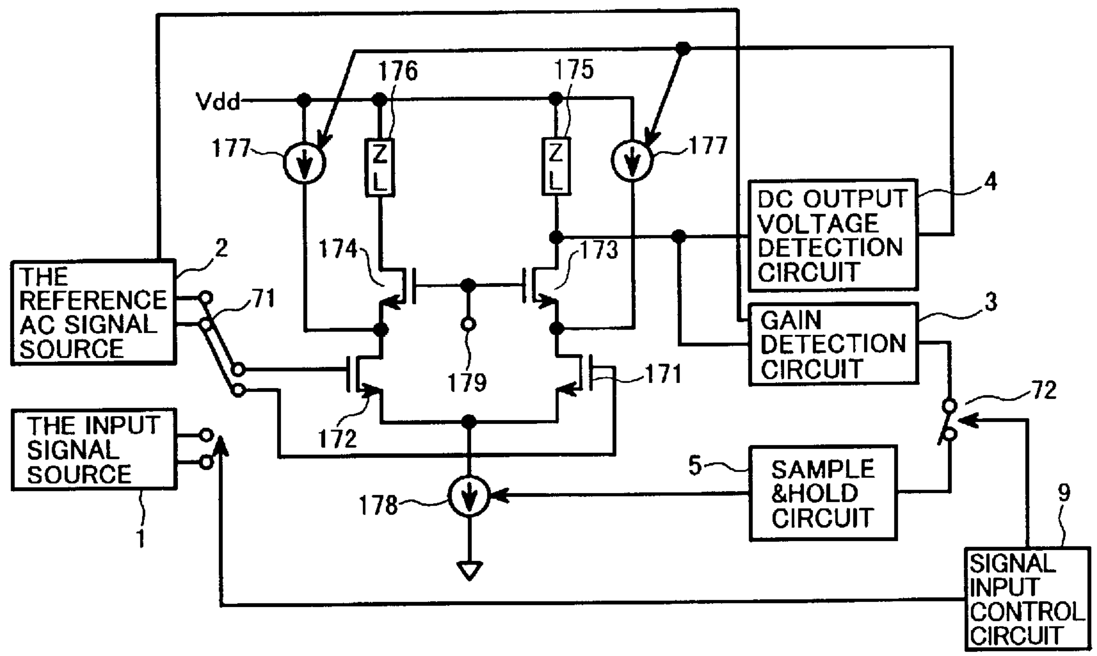
FIG. 17 is a structural view for illustrating a third embodiment of the amplifier with an automatic gain adjustment circuit according to the present invention.
Figure 18:
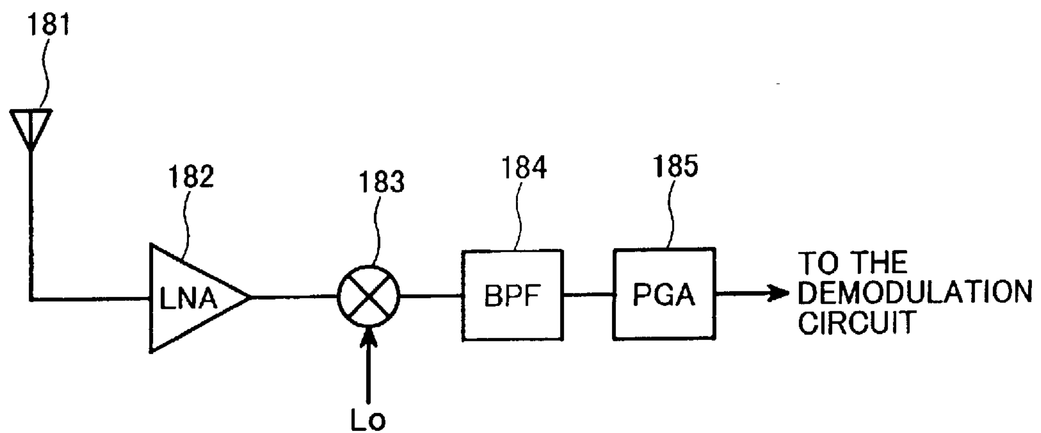
FIG. 18 is a structural view for illustrating a receiving portion of a transceiver.
Figure 19:
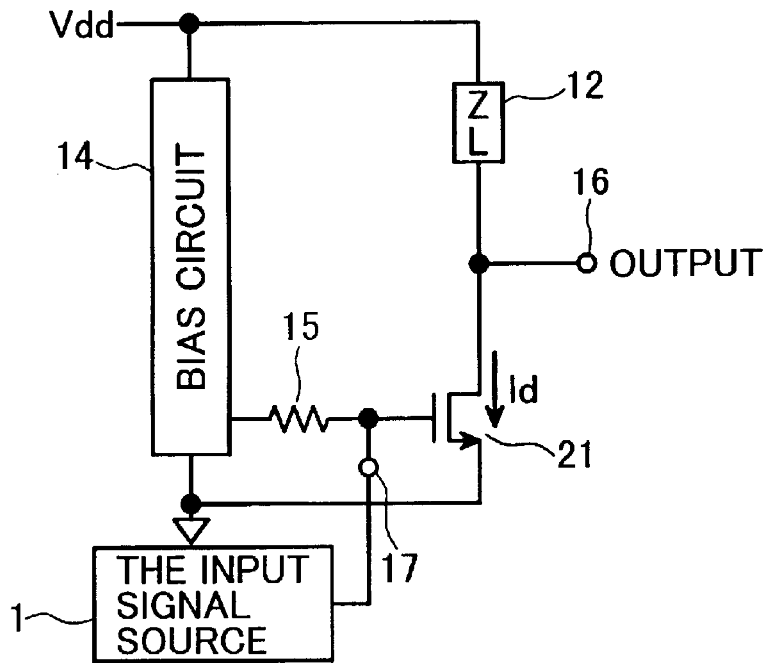
FIG. 19 is a structural view for illustrating a conventional amplifier.
Figure 20:
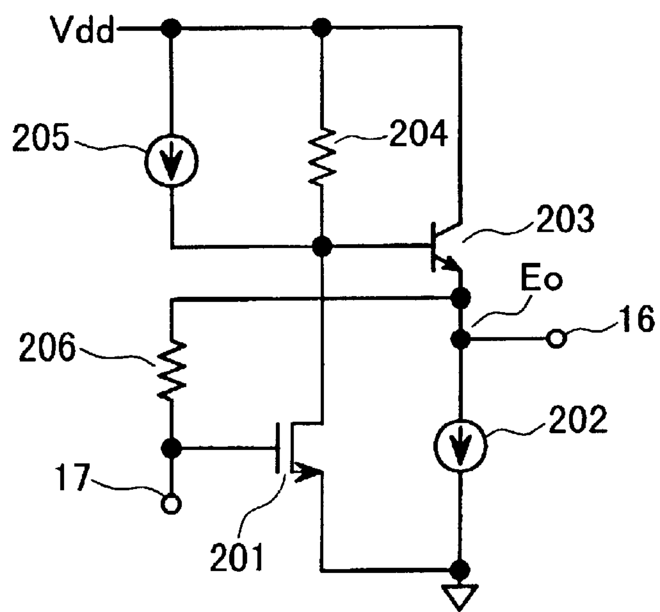
FIG. 20 is a structural view for illustrating another conventional amplifier.

Although each of the embodiments described above has used an amplifier circuit in a source-grounded configuration, an amplifier circuit configured as a differential circuit may also be used instead. FIG. 17 shows a third embodiment of the amplifier with the automatic gain adjustment circuit. A differential pair is formed by MOSFETs 171 and 172 to which MOSFETs 173 and 174 are connected in cascode, respectively. In the MOSTs 171 and 172, drain voltages are determined by a voltage given from a terminal 179.

At first, the SW 71 is set to the position of the reference AC signal source 2 and the SW 72 is turned ON by the signal input control circuit 9. Then, an output signal is fed back to a variable current source 177 by the DC output voltage detection circuit 4 such that the DC output voltage becomes Vr. By feed backing the output of the gain detection circuit 3 to a variable current source 178 via the hold circuit 5, the set gain is obtainable and the control value for the variable current source 178 is held by the hold circuit 5. By subsequently switching the SW 71 to the position of the input signal source 1 and turning OFF the SW 72, the gain adjusted prior to the changeover of the SWs 71 and 72 is obtained for an input signal.

What is claimed is:

1. An automatic gain adjustment circuit comprising:

an amplifying element having a control electrode, a ground electrode, and an output electrode;

a load connected to the output electrode;

an output terminal formed at a connection point between the output electrode and the load;

a bias circuit connected to the control electrode to control a gain of the amplifying element;

a variable current source connected to the output electrode to control a DC output voltage at the output terminal;

a gain detection circuit connected to the output terminal to detect the gain of the amplifying circuit; and a DC output voltage detection circuit for sensing the DC output voltage, wherein the gain of the amplifying circuit and the DC output voltage at the output terminal thereof are adjusted to have respective specified values by controlling the bias circuit with an output of the gain detection circuit and controlling the variable current source with an output of the DC output voltage detection circuit.

2. The automatic gain adjustment circuit according to claim 1, further comprising:

a reference AC signal source for supplying, to the control electrode, a reference AC signal used to adjust the gain of the amplifying element, wherein the gain detection circuit detects the gain by using a signal obtained by amplifying the reference AC signal.

3. The automatic gain adjustment circuit according to claim 1, wherein another amplifying element forming a cascode connection with the amplifying element is disposed between the output electrode of the amplifying element connected to the variable current source and the load.

4. The automatic gain adjustment circuit according to claim 2, wherein a clock signal in a communication device using the automatic gain adjustment circuit is used as the reference AC signal.

5. An amplifier comprising:

an amplifying element having a control electrode, a ground electrode, and an output electrode;

a load connected to the output electrode;

an output terminal formed at a connection point between the output electrode and the load;

a bias circuit connected to the control electrode to control a gain of the amplifying element;

a variable current source connected to the output electrode to control a DC output voltage at the output terminal;

a gain detection circuit connected to the output terminal to detect the gain of the amplifying circuit;

a DC output voltage detection circuit for sensing the DC output voltage;

a reference AC signal source for supplying, to the control electrode, a reference AC signal used to adjust the gain of the amplifying element;

a switch for selecting either one of the reference AC signal and an input signal to be amplified; and a Sample & Hold circuit for holding an output of the gain detection circuit connected between the gain detection circuit and the bias circuit, wherein when the gain of the amplifier element and the DC output voltage at the output terminal thereof are adjusted to have the respective specified values by controlling the bias circuit with the output of the gain detection circuit obtained via the Sample & Hold circuit and controlling the variable current source with an output of the DC output voltage detection circuit, the switch selects the reference AC signal and the Sample & Hold circuit simultaneously receives the output of the gain detection circuit and, when amplification is performed, the switch selects the input signal and the Sample & Hold circuit simultaneously interrupts the reception of the output of the gain detection circuit, while holding the output of the gain detection circuit prior to the interruption.

6. The amplifier according to claim 5, wherein another amplifying element forming a cascode connection with the amplifying element is disposed between the output electrode of the amplifying element connected to the variable current source and the load.

7. The amplifier according to claim 5, wherein a clock signal in a communication device using the amplifier is used as the reference AC signal.

8. An amplifier comprising:

a first amplifying element having a control electrode, a ground electrode, and an output electrode;

a first load connected to the output electrode of the first amplifying element;

a first output terminal formed at a connection point between the output electrode of the first amplifying element and the first load;

an input terminal formed at the control electrode of the first amplifying element to receive a signal to be amplified;

a first variable current source connected to the output electrode of the first amplifying element to control a DC output voltage at the first output terminal; and an automatic gain adjustment circuit for setting a gain of the first amplifying element and a DC output voltage at the first output terminal thereof, wherein the automatic gain adjustment circuit comprises:

a second amplifying element;

a second load connected to an output electrode of the second amplifying element;

a second output terminal formed at a connection point between the output electrode of the second amplifying element and the second load;

a bias circuit connected to a control electrode of the second amplifying element to control a gain of the second amplifying element;

a second variable current source connected to the output electrode of the second amplifying element to control a DC output voltage at the second output terminal;

a gain detection circuit connected to the second output terminal to detect the gain of the second amplifying element; and a DC output voltage detection circuit for sensing a DC output voltage at the second output terminal and adjusts the gain of the second amplifying element and the DC output voltage at the second output terminal thereof to have respective specified values by controlling the bias circuit with an output of the gain detection circuit and controlling the second variable current source with an output of the DC output voltage detection circuit, wherein an output of the bias circuit given to the control electrode of the second amplifying element is supplied to the control electrode of the first amplifying element, and the first variable current source is controlled with the output of the DC output voltage detection circuit.

9. The amplifier according to claim 8, further comprising:

a reference AC signal source for supplying, to the control electrode of the second amplifying element, a reference AC signal used to adjust the gain of the second amplifier, wherein the gain detection circuit detects the gain by using a signal obtained by amplifying the reference AC signal.

10. The amplifier according to claim 8, wherein a third amplifying element forming a cascode connection with the first amplifying element is disposed between the output electrode of the first amplifying element connected to the first variable current source and the first load, and a fourth amplifying element forming a cascode connection with the second amplifying element is disposed between the output electrode of the second amplifying element connected to the second variable current source and the second load.

11. The amplifier according to claim 9, wherein a clock signal in a communication device using the amplifier is used as the reference AC signal.

* * * * *